(12) United States Patent
Crosland et al.

(10) Patent No.: US 10,854,422 B2
(45) Date of Patent: Dec. 1, 2020

(54) CHARGED PARTICLE BEAM STEERING ARRANGEMENT

(71) Applicant: RELIANCE PRECISION LIMITED, Huddersfield (GB)

(72) Inventors: Nigel Crosland, Linton (GB); Andrew McClelland, Cambridge (GB); Phil Hoyle, Chesterton (GB); Ian Laidler, Huddersfield (GB)

(73) Assignee: RELIANCE PRECISION LIMITED, Huddersfield (GB)

( * ) Notice: Subject to any disclaimer, the term of this patent is extended or adjusted under 35 U.S.C. 154(b) by 0 days.

(21) Appl. No.: 16/342,859

(22) PCT Filed: Oct. 18, 2017

(86) PCT No.: PCT/EP2017/076636
§ 371 (c)(1),
(2) Date: Apr. 17, 2019

(87) PCT Pub. No.: WO2018/073319
PCT Pub. Date: Apr. 26, 2018

(65) Prior Publication Data
US 2019/0252152 A1    Aug. 15, 2019

(30) Foreign Application Priority Data
Oct. 19, 2016    (GB) .................................. 1617693.5

(51) Int. Cl.
*H01J 37/305* (2006.01)
*B22F 3/10* (2006.01)
(Continued)

(52) U.S. Cl.
CPC .......... *H01J 37/305* (2013.01); *B22F 3/1055* (2013.01); *H01J 37/1472* (2013.01);
(Continued)

(58) Field of Classification Search
CPC ........................ B22F 3/1055; B22F 2999/00; B22F 2202/11; B29C 64/153; B29C 64/20;
(Continued)

(56) References Cited

U.S. PATENT DOCUMENTS 9,399,321 B2 * 7/2016 Ljungblad ............. B29C 64/153
9,406,483 B1 * 8/2016 Lock .................. B23K 15/0086
(Continued)

FOREIGN PATENT DOCUMENTS

EP    3059031 A1    8/2016
EP    3223299 A1    9/2017
(Continued)

OTHER PUBLICATIONS

Fodor, Anna, "International Search Report and Written Opinion", dated Jan. 10, 2018, issued in PCT Application No. PCT/EP2017/076636, filed Oct. 2017.

*Primary Examiner* — David A Vanore
(74) *Attorney, Agent, or Firm* — Perry + Currier, Inc.

(57) ABSTRACT

A method of forming a product using additive layer manufacture is provided. The method comprises forming the product as a series of layers, each layer being formed by fusing powder deposited as a powder bed by scanning the powder bed using a charged particle beam to form a desired layer shape. For each layer, the powder is fused by melting successive areas of the powder bed by scanning the charged particle beam using a combination of a relatively long-range deflector and a relatively short-range deflector, wherein the relatively long-range deflector deflects the charged particle beam over a larger deflection angle than the short-range deflector. Also provided are a corresponding charged particle optical assembly, and an additive layer manufacturing apparatus.

20 Claims, 7 Drawing Sheets

(51) Int. Cl.
*B22F 3/105* (2006.01)
*H01J 37/147* (2006.01)
*H01J 37/302* (2006.01)

(52) U.S. Cl.
CPC ........ *H01J 37/1475* (2013.01); *H01J 37/302* (2013.01); *H01J 37/3023* (2013.01); *B22F 2003/1056* (2013.01); *B22F 2003/1057* (2013.01); *H01J 2237/30483* (2013.01); *Y02P 10/295* (2015.11)

(58) Field of Classification Search
CPC ....... B29C 64/268; B33Y 30/00; B33Y 50/02; H01J 37/305; H01J 2237/30472; H01J 2237/3128; H01J 37/145; H01J 37/1474
USPC ........................ 250/206.1, 341.1, 395, 396 R
See application file for complete search history.

(56) References Cited

U.S. PATENT DOCUMENTS

| | | | | |
|---|---|---|---|---|
| 9,415,443 | B2* | 8/2016 | Ljungblad | B22F 3/1055 |
| 9,468,973 | B2* | 10/2016 | Ljungblad | B22F 3/1035 |
| 9,505,057 | B2* | 11/2016 | Nordkvist | B29C 64/153 |
| 9,505,172 | B2* | 11/2016 | Ljungblad | B29C 64/20 |
| 9,550,207 | B2* | 1/2017 | Ackelid | B05D 3/068 |
| 9,561,542 | B2* | 2/2017 | Ackelid | B22F 3/1055 |
| 9,676,031 | B2* | 6/2017 | Ljungblad | B22F 3/1055 |
| 9,676,033 | B2* | 6/2017 | Hellestam | B33Y 10/00 |
| 9,718,129 | B2* | 8/2017 | Ljungblad | B29C 64/153 |
| 9,782,933 | B2* | 10/2017 | Jonasson | B29C 64/386 |
| 9,789,541 | B2* | 10/2017 | Fager | B22F 3/1055 |
| 9,789,563 | B2* | 10/2017 | Elfstroem | B22F 3/1055 |
| 9,802,253 | B2* | 10/2017 | Jonasson | B29C 64/386 |
| 9,950,367 | B2* | 4/2018 | Backlund | B23K 26/0648 |
| 10,610,930 | B2* | 4/2020 | Nordkvist | B29C 64/153 |
| 2013/0214172 | A1* | 8/2013 | Touya | H01J 37/3007 250/396 R |
| 2016/0054347 | A1* | 2/2016 | Snis | B23K 15/0086 250/341.1 |
| 2016/0217968 | A1* | 7/2016 | Li | H01J 37/1477 |
| 2019/0252152 | A1* | 8/2019 | Crosland | H01J 37/302 |
| 2019/0358737 | A1* | 11/2019 | Richardson | G06T 17/00 |
| 2019/0362936 | A1* | 11/2019 | Van Den Berg | B33Y 50/02 |
| 2019/0375010 | A1* | 12/2019 | Richardson | B22F 3/008 |
| 2019/0389130 | A1* | 12/2019 | Richardson | B29C 64/393 |

FOREIGN PATENT DOCUMENTS

| | | |
|---|---|---|
| WO | 2016156824 A1 | 10/2016 |
| WO | 2016182790 A1 | 11/2016 |

* cited by examiner

CHARGED PARTICLE BEAM STEERING ARRANGEMENT

FIELD OF THE INVENTION

The present invention relates to an additive layer manufacturing apparatus comprising a novel charged particle beam steering arrangement and, in particular, to a novel electron beam steering arrangement. The present invention also extends to a method of steering a charged particle beam such as an electron beam in an additive layer manufacturing apparatus.

BACKGROUND TO THE INVENTION

Additive layer manufacturing is a maturing field. The technique sees energy injected into a substrate medium to alter parts of the substrate, for example to melt, fuse or harden the substrate, so that it forms a layer of a product to be formed. New substrate medium is added and the next layer formed, and so on. In this way, a product may be formed layer-by-layer.

The substrate medium may be selected from many different materials according to need. For example, plastics and metals are commonly used as substrate media. Metal may be provided in powder form from one or more hoppers and spread over a work table to form a powder bed. As each layer is formed, the work table may be lowered by the depth of the powder bed, and a new powder bed deposited on the part-formed product.

The energy source is typically either a laser beam or an electron beam. The present invention is primarily concerned with electron beam sources, although extends to other types of charged particle beams. Such electron beam sources are controlled using electric and/or magnetic fields to steer or condition the electron beam. Commonly, an electron beam is used as the energy source and is steered using electromagnetic deflectors. These electromagnetic deflectors allow the electron beam to be scanned across the substrate medium, such that a pattern may be scanned or traced over the substrate medium.

At the design stage, the product to be formed is mapped into XYZ Cartesian coordinates. The product may then be "deconstructed" into layers that will be formed successively to make the final product. Each layer to be formed is described using XY Cartesian coordinates (the Z coordinate is fixed for each layer). The electromagnetic deflectors are used to scan the electron beam according to a desired path defined using the XY coordinates as an addressable grid. The shape to be formed in the powder bed for any particular layer is formed by the beam as the beam follows a scan pattern. The scan pattern usually comprises simple lines of variable lengths, defined by vectors (for example linking a start point and an end point for each straight line). These lines combine to form the desired shape for the layer.

As the electron beam is scanned over the powder bed, energy is deposited into the powder, raising its temperature. Exposure to the electron beam is carefully controlled to ensure complete melting of powder so that the powder particles within the top layer fuse together and so that the powder particles within the top layer also fuse with the previous layer thereby forming a solid product. However, the energy deposited into the powder bed must be controlled to prevent the generation of defects and ensure the correct formation of the material microstructure.

A melt pool forms as the electron beam delivers its energy and as the heat is conducted through the metal powder. Rather than depositing all the required energy into a particular location of the powder bed in one go by controlling the electron beam to dwell at that location, the electron beam is usually scanned continuously within the melt pool. Typically, the electron beam visits a location multiple times. Each time the electron beam passes over a location, the electron beam raises the temperature of that location incrementally until the powder melts. It is also known to form multiple separated melt pools rather than just a single melt pool at any one time. Thus the electron beam may scan continuously within a particular melt pool and then be deflected a relatively long distance across the powder bed to another melt pool, and so on.

Moving the electron beam from melt pool to melt pool means that beam time and power is wasted as areas of the powder bed are traversed repeatedly that do not require melting. Attempts to address this problem to date have focussed on developing scan algorithms to optimise the scan strategy and thermal control. For example, much effort has been focussed on how best to transform each layer's shape into a scan pattern that minimises transit of areas of the powder bed that do not require melting. However, these techniques are complex and geometry dependant. Generally, a bespoke scan pattern must be developed for each product being made.

Also, current scan patterns place quite different requirements on the electron beam control. Beam deflection speeds as high as 8000 m/s have been reported for deflecting the electron beam between melt pools, whereas slow deflection speeds of tens of m/s are said to be required for achieving reasonable melt characteristics when scanning within each melt pool. Satisfying the different requirements for scanning within a melt pool as opposed to scanning between melt pools presents a great challenge when designing the electromagnetic deflectors.

SUMMARY OF THE INVENTION

From a first aspect, the present invention resides in a method of forming a product using additive layer manufacture. The method comprises forming the product as a series of layers, each layer being formed by fusing powder deposited as a powder bed by scanning the powder bed using a charged particle beam to form a desired layer shape. For each layer, the powder is fused by melting successive areas of the powder bed by scanning the charged particle beam using a combination of a relatively long-range deflector and a relatively short-range deflector wherein the relatively long-range deflector deflects the charged particle beam over a larger deflection angle than the short-range deflector.

The charged particle beam may be an electron beam, and the charged particle beam is assumed to be an electron beam below. However, it is to be understood that where the following describes an electron beam, it could just as easily describe a charged particle beam and the present invention is not restricted to electron beams. The powder may be a metallic powder.

It has been realised that there are two aspects of beam steering and control, and that these two aspects can be separated. First, there is the long range deflection that allows the beam to access all areas of the powder bed. This long range deflection may be used to scan the electron beam between melt pools. Hence, the relatively long-range deflector may be used to set a position of the charged particle beam on the powder bed.

Second, there is the short-range deflection of the electron beam used to achieve a desired scan pattern with the electron beam. Hence, the relatively short-range deflector may be used to scan the electron beam about the positions set by the relatively long-range deflector. The precision of the relatively long- and short-range deflectors may be the same. That is the relatively long- and short-range deflectors may be able to set the position of the electron beam on the powder bed with the same precision. Although the precision may be the same, the relatively long-range deflector is generally used to move the electron beam between positions with greater step sizes than the relatively short-range deflector.

It has been realised that the long range deflection may be effected by a first deflector, the relatively long-range deflector (sometimes referred to herein as the "mainfield" deflector), and the precise deflection may be effected as a small scale deflection by a second deflector, the relatively small-range deflector (sometimes referred to herein as the "subfield" deflector). The relatively long-range deflector may deflect the electron beam over the full extent of the powder bed, or at least over the majority of the powder bed. On the other hand, the relatively short-range deflector may deflect the electron beam over very much shorter distances. For example, the relatively short-range deflector may deflect the electron beam over only a fraction of the range of the relatively long-range deflector, for instance 10% or less, or 1% or less of the range. As the roles of the relatively long- and short-range deflectors are separated, the design of the deflectors may be optimised for their respective roles. For example, a slow relatively long-range deflector may be used to effect the long range movement of the electron beam, whereas a faster relatively short-range deflector may be used to effect the very much shorter range movement of the electron beam.

As much faster scan rates may be achieved for the electron beam using the relatively short-range deflector, energy may be deposited into the powder bed at a rate suitable for controlled dispersal of thermal energy into the powder bed. This allows the temperature of a location to be raised continuously as the electron beam revisits that location, rather than see the temperature drop between exposures to the electron beam. Consequently, in effect, an area can be increased in temperature simultaneously rather than in the staggered manner achieved by the prior art "line scan" method. Thus, the present invention may be thought of as an "area scanner" rather than as a "line scanner". That is, because the scan rate is many times faster than the propagation of heat through the powder bed, the area of the scan can be considered as if it had been exposed to a single beam having a very specific shape. The area's thermal profile can be tailored to compensate for the boundary conditions of the area and ensure uniform melt.

Accordingly, the method of the present invention may comprise using the relatively long-range deflector to set a base position of the electron beam on the powder bed and using the relatively small-range deflector to scan the electron beam around the base position set by the relatively long-range deflector. The method may comprise using the relatively small-range deflector to scan the electron beam to trace a predetermined shape on the powder bed. The predetermined shape, or "primitive" as it is otherwise called herein, may be selected from a library of such predetermined primitives. The primitives may comprise shapes such as squares, rectangles, triangles and hexagons. Irregular primitives may be used too. Also, primitives may be combined to form compound shapes about the base position set by the relatively long-range deflector, for example by combining two rectangles to form an L-shaped compound shape.

The method may further comprise repeated steps of using the relatively long-range deflector to set different base positions of the electron beam on the powder bed and using the relatively small-range deflector to scan the electron beam around each of the different base positions set by the relatively long-range deflector to trace a series of predetermined shapes on the powder bed, wherein the predetermined shapes combine to create the desired layer shape. For example, the predetermined shapes may be arranged to abut or overlap to fill the desired layer shape. The majority of the predetermined shapes may have a common size and shape and tessellate to form part of the desired layer shape. Not all predetermined shapes may be the same. For example, the majority of a layer shape may be formed using the same predetermined shape, but other shapes may be required to create the required edge to the layer shape. For example, squares may be used to form the interior of the layer shape, whereas the required edge may be approximated using a series of triangles.

The method may comprise using the relatively long-range deflector to set an array of base positions of the electron beam on the powder bed, with the predetermined shapes scanned by the electron beam about each base position tessellating without leaving gaps therebetween thereby forming a part of the desired shape. For example, squares may be used for the majority of predetermined shapes, in which case the relatively long-range deflector may be used to move the electron beam between a square array of positions on the powder bed.

The relatively long-range deflector is preferably used to scan the electron beam at a relatively slow speed and the relatively short-range deflector is used to scan the electron beam at a relatively fast speed. An electrostatic or electromagnetic deflector may be used in either or both the relatively long-range deflector and the relatively short-range deflector. Where one or more electromagnetic deflectors are used, they will typically comprise turns of coils of wire or other electrical current-carrying material. As large deflection is required from the relatively long-range deflector, a relatively large number of turns may be used that may be driven by a relatively large current (relative to the current passed through the relatively short-range deflector). The large current and high number of turns in the relatively long-range deflector means that it has a relatively high inductance and hence a relatively slow slew rate (again, relative to the relatively short-range deflector). In contrast, as the relatively short-range deflector is required only to provide small deflections of the electron beam, a relatively low number of turns may be used and a relatively small current may be used to drive the coils. This means that the relatively short-range deflector has a relatively low inductance and hence a relatively high slew rate. Consequently, the scan speeds achievable for the electron beam while following the desired scan pattern within a melt pool is increased relative to the prior art. By way of example only, the relatively long-range deflector may be an electromagnetic deflector comprising a Helmholtz coil with more than 25 turns per coil and the relatively short-range deflector may be an electromagnetic deflector comprising a Helmholtz coil with fewer than 5 turns per coil.

Advantageously, the method may comprise using the relatively short-range deflector to scan the electron beam to trace each predetermined shape at a speed fast enough such that the temperature of the powder bed at the start position of the scan is substantially the same as temperature at the end position of the scan when the electron beam has completed the scan to trace the predetermined shape. The method may further comprise repeatedly using the relatively small-range deflector to scan the electron beam to trace the same predetermined shape at each base position on the powder bed, thereby raising and maintaining the temperature of the powder bed evenly within the predetermined shape. As noted above, this method may be thought of as an "area scanner" rather than as a "line scanner". That is, because the scan rate is many times faster than the propagation of heat through the powder bed, the area of the scan to create the predetermined shape can be considered as if it had been exposed to a single beam having the predetermined shape. Also, edge effects caused by the edge of the melt pool losing more heat to surrounding unheated powder bed can be addressed. Namely, the area's thermal profile can be tailored to compensate for the boundary conditions of the area and ensure uniform melt.

Movement of the electron beam using the relatively long-range and short-range deflectors may be performed together or separately.

When performed separately, the method may comprise setting the relatively long-range deflector to position the electron beam at the base position of the electron beam on the powder bed, maintaining the setting of the relatively long-range deflector while varying the setting of the relatively short-range deflector to scan the electron beam around the base position set by the relatively long-range deflector. The method may then comprise further steps of changing the setting of the relatively long-range deflector to position the electron beam at a different base position of the electron beam on the powder bed, maintaining the setting of the relatively long-range deflector while varying the setting of the relatively short-range deflector to scan the electron beam around the different base position set by the relatively long-range deflector. Thus, a series of predetermined shapes may be traced with the electron beam scanning about a base position set by the relatively long-range deflector to form the predetermined shape before the relatively long-range deflector is used to move the electron beam onto the next base position for the next shape to be traced, and so on.

When the relatively long-range and short-range deflectors are used together the method may comprise varying the relatively long-range deflector to scan the electron beam through a series of base positions of the electron beam on the powder bed while varying the setting of the relatively short-range deflector to scan the electron beam around the base positions set by the relatively long-range deflector. For example, the relatively long-range deflector may be used to cause a slow scan of the electron beam across the powder bed while the relatively short-range deflector may be used to cause the electron beam to perform a fast scan about the base position set by the relatively long-range deflector, thereby forming the desired shape. Advantageously, as control of the electron beam is split between two different deflectors, the relatively short-range deflector that may be optimised for fast scan speeds and high slew rates may be used to effect a very much faster scan of the electron beam than if a single deflector was used to effect both the long-range, low slew rate scan of the electron beam across the powder bed as well as the short-range, high slew rate, fast scan.

From a further aspect, the present invention resides in a charged particle optical assembly for use in additive layer manufacture. The assembly comprises a charged particle source; and beam forming apparatus operable to form a beam of charged particles from the charged particle source provided by the charged particle source that travels along a direction of propagation. The assembly further comprises beam steering apparatus; wherein the beam steering apparatus comprises a long-range deflector operable to deflect the charged particle beam over a relatively large deflection angle and a short-range deflector operable to deflect the charged particle beam over only a relatively small deflection angle. The large and small deflection angles are seen as long- and short-range movement of the charged particle beam over the powder bed. As noted above, the charged particle beam may be an electron beam, and the charged particle beam is assumed to be an electron beam below. However, it is to be understood that where the following describes an electron beam, it could just as easily describe a charged particle beam and the present invention is not restricted to electron beams.

The long-range deflector may be arranged to cause the electron beam to deflect transversely to the direction of propagation. The long-range deflector may comprise first and second deflectors arranged to act orthogonally with respect to each other and to the direction of propagation.

The short-range deflector may be arranged to cause the electron beam to deflect transversely to the direction of propagation. The short-range deflector may comprise first and second deflectors arranged to act orthogonally with respect to each other and to the direction of propagation. Where both the long-range deflector and the short-range deflector comprise first and second deflectors as described above, the first deflectors of the long-range deflector and the short-range deflector may be arranged to deflect the electron beam in a common direction. Also, the second deflectors of the long-range deflector and the short-range deflector may be arranged to deflect the electron beam in a common direction. Hence, if the direction of propagation is considered to define the Z axis of a Cartesian coordinate system, the first deflectors of the long- and short-range deflectors may be arranged to deflect the electron beam in the X direction and the second deflectors may then be arranged to deflect the electron beam in the Y direction.

Any, including all, of the deflectors may comprise electromagnetic deflectors, for example Helmholtz coils. The Helmholtz coils may comprise a coil of wire of other electrical current carrying medium arranged to either side of the electron beam path. Where Helmholtz coils are used for either or both the first and second deflectors of the long-range deflector, each coil may comprise 50 to 100 turns of wire. Where Helmholtz coils are used for either or both the first and second deflectors of the short-range deflector, each coil may comprise 1 to 5 turns of wire.

Rather than using electromagnetic deflection, electrostatic deflection may be used to steer the electron beam. Hence, the first and second deflectors of both the long-range deflector and the short-range deflector may comprise electrostatic deflectors that are arranged to either side of the electron beam path.

Where electrons are used as the charged particles, the charged particle optical assembly may comprise an electron source acting as the charged particle source. The beam forming apparatus may then form an electron beam, and the beam steering apparatus may steer the electron beam.

The present invention also resides in an additive layer manufacturing apparatus comprising any of the electron optical assemblies described above, at least one hopper operable to dispense powder, and a table positioned to receive the powder dispensed by the at least one hopper in a volume defining a powder bed for receiving the electron beam.

Optionally, the long-range deflector is operable to scan the electron beam over at least half the area of the powder bed, for example over at least 75%, 90% or 95% of the area of the powder bed. Optionally, the short-range deflector is operable to scan the electron beam over less than half the area of the powder bed, for example over less than 25%, 10%, 5% or 1% of the area of the powder bed.

The additive layer manufacturing may further comprise a controller programmed to perform any of the methods described above.

BRIEF DESCRIPTION OF THE DRAWINGS

In order that the invention can be more readily understood, reference will now be made by way of example only, to the accompanying drawings in which:

FIG. 2 is a schematic representation of an electron source and electromagnetic deflector assembly operable to provide an electron beam and to scan the electron beam in accordance with embodiments of the present invention, with FIG. 2a corresponding to a side view and FIG. 2b corresponding to a view through line B-B of FIG. 2a;

DETAILED DESCRIPTION OF EMBODIMENTS

Figure 1:
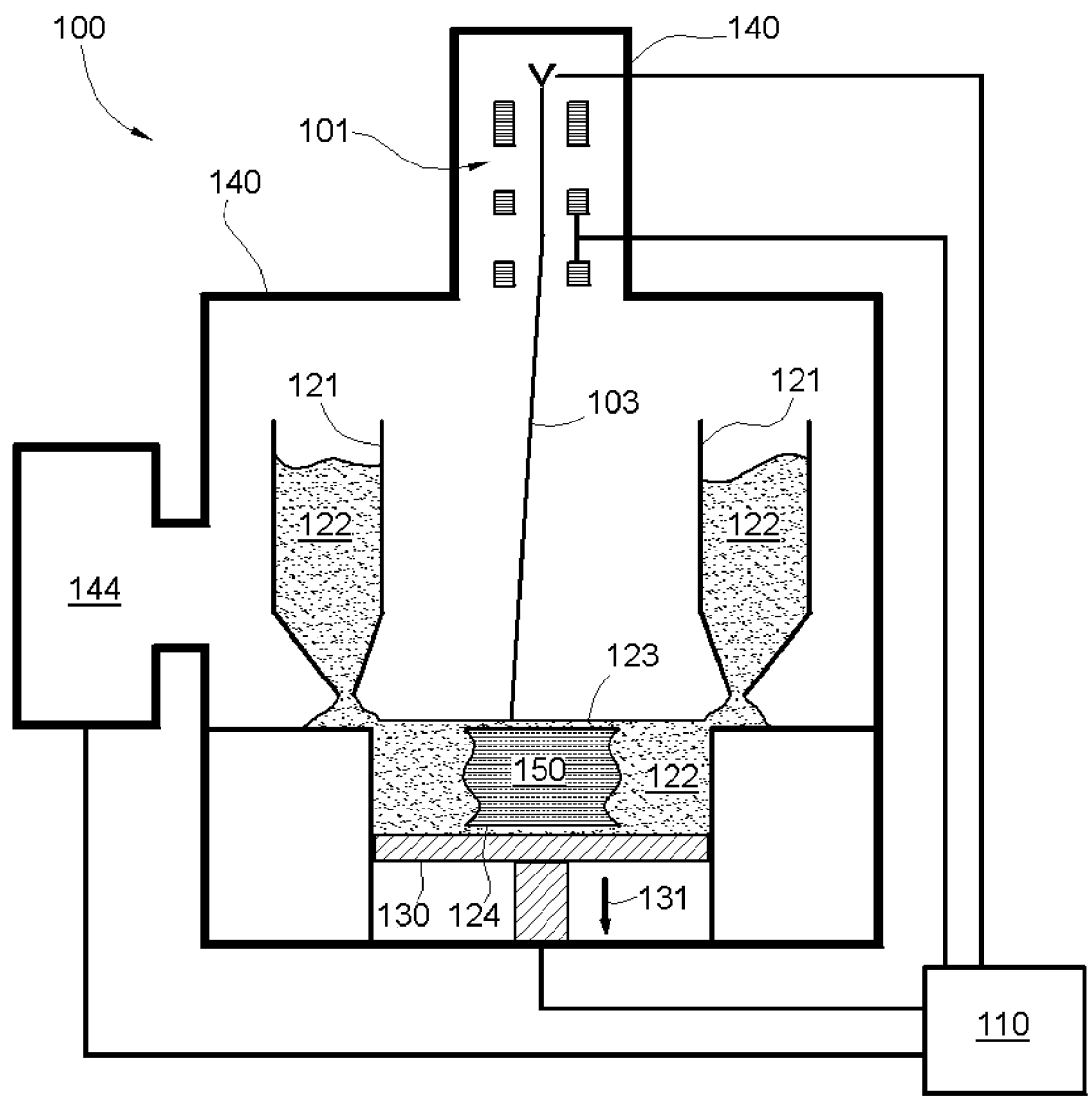
FIG. 1 shows additive layer manufacture apparatus with which the present invention may be used.

FIG. 1 shows additive manufacturing apparatus 100 in which embodiments of the present invention may be implemented. The apparatus 100 is for additive layer manufacture of products from metal powder using an electron beam.

To this end, the apparatus 100 comprises an electron optical assembly 101 that forms, conditions and steers an electron beam 103, as will be described in more detail below. The apparatus 100 further comprises powder hoppers 121 containing metal powder 122 and a movable table 130. The hoppers 121 dispense powder so as to lay down a thin layer of the powder on the table 130. Any number of hoppers 121 may be used, and the two shown in FIG. 1 is but merely an example. A mechanism such as a scraper or blade (not shown) may be used to disperse the powder 122 evenly over the table 130. The electron optical assembly 101 steers the electron beam 103 such that the electron beam 103 is scanned over the powder bed 123 to fuse the powder 122 and form a solid product 150.

After each layer of the product 150 has been formed, the table 130 is lowered in the direction indicated by arrow 131. The table 130 is lowered such that the top surface of the powder bed 123 is always formed at the same height relative to the electron beam 103. The initial layer of the powder bed 123 may be deposited to be thicker than the successive layers to minimise heat conduction to the table 130 which may cause the powder 122 to fuse with the table 130. Thus, a complete layer of unmelted powder 124 is left beneath the product 150 as it is formed.

Additive manufacture using electron beams is generally performed under vacuum conditions, hence the apparatus 100 comprises an enclosing vacuum chamber 140. The vacuum within the vacuum chamber 140 is created and maintained by a pumping system 144, such as any commonly available pumping system, for example a turbomolecular pump backed by a roughing pump. The pumping system 144 may be controlled by the controller 110. As shown in FIG. 1, the pumping system 144 may be used to evacuate the portion of the vacuum chamber 140 housing the electron optical assembly 101. The pressure in the vacuum chamber 140 may be in the range of $1 \times 10^{-3}$ mbar to $1 \times 10^{-6}$ mbar.

To this end, the apparatus 100 comprises an electron optical assembly 101 including an electron source 102 for generating electrons, lenses 220 for conditioning and forming an electron beam 103 from the emitted electrons and electromagnetic deflectors 240 and 250 for steering the electron beam 103. Operation of the electron source 102 and deflectors 104 is controlled by a controller 110 such as a suitably programmed computer.

Figure 2A:
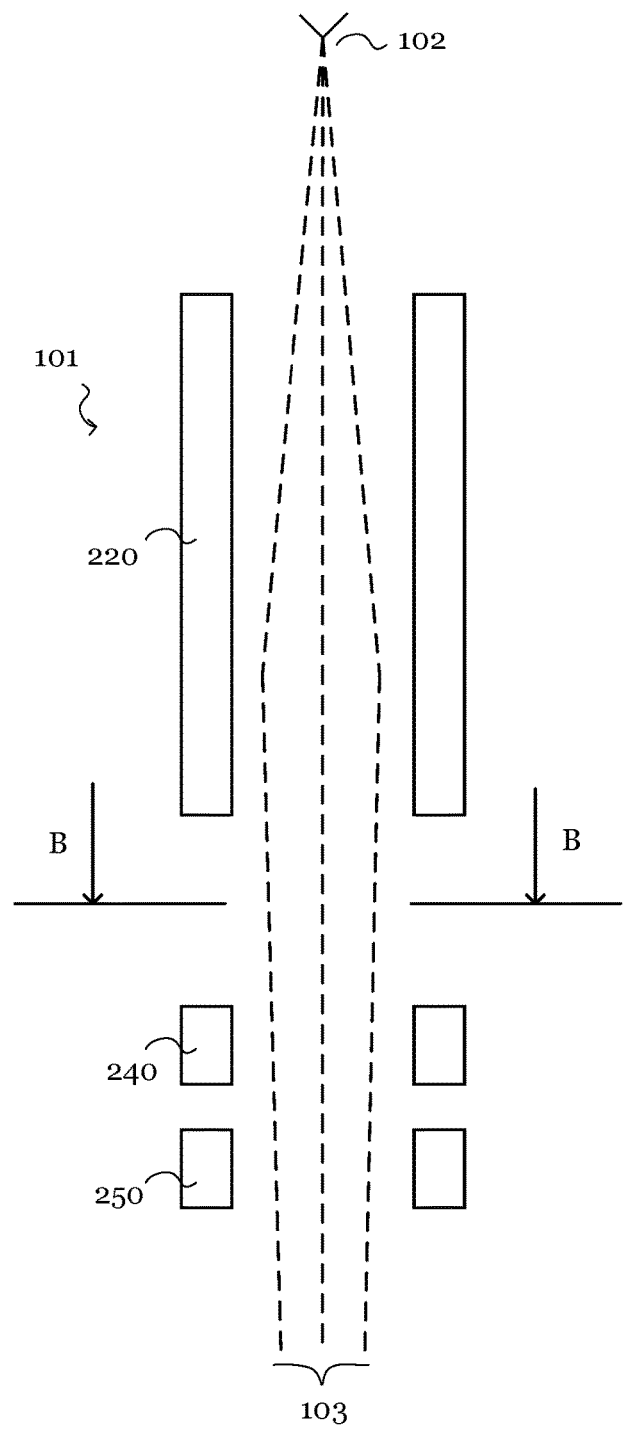
Figure 2B:
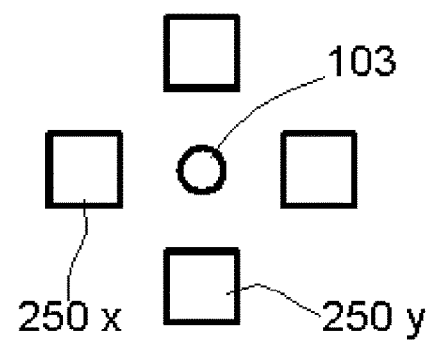

FIGS. 2a and 2b show the electron optical assembly 101 in more detail. The electron optical assembly 101 comprises an electron source 102 for generating electrons, lenses 220 for forming and conditioning an electron beam 103 from the emitted electrons, and electromagnetic deflectors 240 and 250 for steering the electron beam 103. Operation of the electron source 102, lenses 220 and deflectors 240, 250 is controlled by a controller 110 such as a suitably programmed computer. Any conventional arrangement of electron source 103 and lenses 220 may be used, and so will not be described in detail here.

Essentially, the electron source 103 and lenses 220 deliver a focussed electron beam 103 that is travelling along the central axis 202 of the electron optical assembly 101.

Then, the electromagnetic deflectors 240 and 250 act to steer the electron beam 103 across the powder bed 123 thereby scanning the electron beam 103 according to a desired scan pattern. The second of these deflectors 250 deflects the electron beam over larger distances, and is referred to herein as the mainfield deflector 250. This mainfield deflector 250 provides longer range steering of the electron beam 103, and can steer the electron beam 103 across the full range (or "mainfield") of the powder bed 123. The deflector that deflects the electron beam over smaller distances is the subfield deflector 240 which effectively applies a small dynamic disturbance to the electromagnetic field produced by the mainfield deflector 250. This dynamic disturbance scans the electron beam 103 about the position set by the mainfield deflector 250. Thus, use of the subfield deflector 240 allows the electron beam 103 to be scanned through a small area or "subfield" of the powder bed 123 about the base position set by the mainfield deflector 250. Different subfields may be scanned by moving the electron beam 103 to a different area of the powder bed 123 using the mainfield deflector 250, as will be described in more detail below.

Each of the deflectors 240, 250 described above may be conventional electromagnetic deflectors comprising paired current-carrying coils like Helmholtz coils or conventional electrostatic deflectors comprising paired conductive plates set to appropriate potentials. In either case, the deflectors are operated by the controller 110 to provide the desired deflection, as is well known in the art.

The mainfield deflectors 250 and the subfield deflectors 240 act transverse to the path of the electron beam 103 to steer the electron beam 103 away from the central axis 202

(or to keep the electron beam 103 travelling along the central axis 202). This steering is separated into orthogonal components controlled by separate deflectors. Accordingly, the deflectors 240, 250 are provided in orthogonally disposed pairs to effect control of the electron beam 103 in both X and Y coordinates, as shown in FIG. 2b. Hence, there are four elements in each deflector. For example, FIG. 2b shows the mainfield deflector 250 comprising two Helmholtz coils. A first pair of coils 250x are located to either side of the electron beam 103 and separated in the X coordinate direction thereby allowing the electron beam 103 to be steered in the X direction. A second pair of coils 250y are located to either side of the electron beam 103 and separated in the Y coordinate direction thereby allowing the electron beam 103 to be steered in the Y direction. This arrangement is repeated for the subfield deflector 240.

The mainfield deflector 250 should be able to scan the electron beam 103 over distances such as 0.1 m, 0.2 m, 0.3 m, 0.4 m, 0.5 m or even larger (in both X and Y coordinates, although the X and Y deflection ranges need not be matched to provide square mainfields such that rectangular mainfields may also arise). To provide this relatively large deflection range, the mainfield deflector 250 may be designed as Helmholtz coils with typically 50 to 100 turns of wire per coil carrying around 1 to 10 A of current, and operating at frequencies around 100 kHz. Alternatively, parallel electrode plates may be used in each axis across which a variable voltage of magnitude of around ±5,000 V would be applied in order to deflect the electron beam 103 in both the positive and negative X and Y directions.

The subfield deflector 240 produces far finer deflection ranges, for example distances of 0.001 m, 0.025 m, 0.005 m, 0.01 m or 0.05 m (in both X and Y directions), although should be able to drive the electron beam far more quickly than the mainfield deflector 250. Accordingly, the subfield deflector 240 is likely to be of a different design. For example, where a Helmholtz coil is used, each coil will contain typically only a single turn or a few turns of wire, carrying typically hundreds of milliamps up to 1 A of current, and operating at frequencies around 25 MHz. Alternatively, parallel electrode plates may be used in the subfield deflector 240, as for the mainfield deflector 250, but with a lower requirement on the applied voltage, such as ±200 V.

Figure 3:
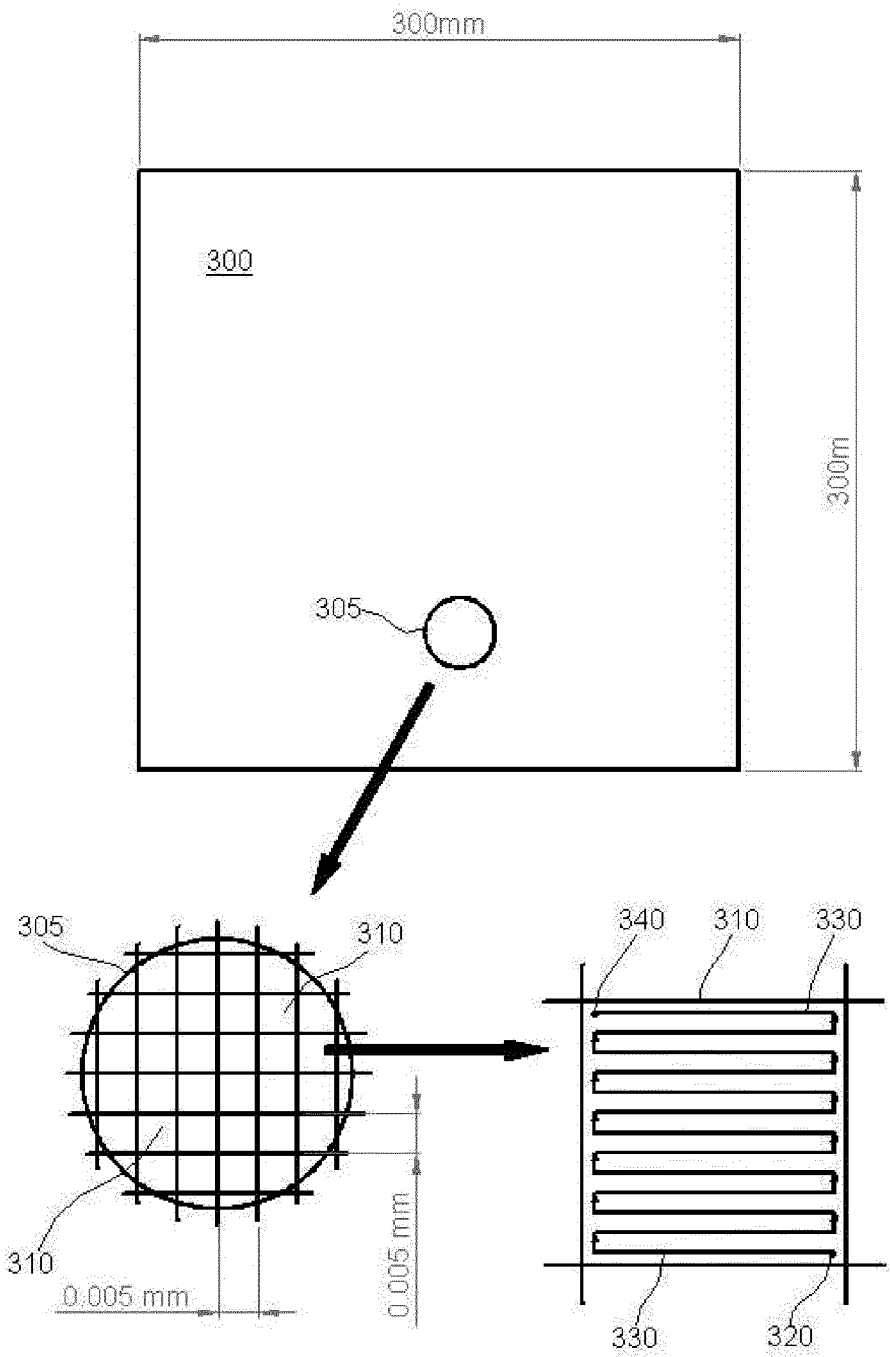
FIG. 3 is a schematic representation of a powder bed forming a mainfield to be scanned by the electron beam, and how the mainfield may be divided into subfields and primitives.

Further description will now be provided of the mainfield, subfields and "primitives" with reference to FIG. 3. As noted above, the range of deflection of the electron beam 103 provided by the mainfield deflector 250 defines the size and shape of the mainfield. Typically, the range of deflection in the X and Y directions will be the same such that a square mainfield results. FIG. 3 shows an example of a mainfield 300 extending 0.3 m by 0.3 m. The powder bed 123 may or may not correspond to this size. For example, the powder bed may be slightly bigger to allow a margin around the mainfield 300 such that powder from the edge of the powder bed 123 does not fuse with the surrounding parts of the apparatus 100.

As mentioned above, the electron beam 103 may be set to any position in the mainfield using the mainfield deflector 250. The electron beam 103 may then be scanned using the subfield deflector 240. The size of each subfield is set by the range of movement provided by the subfield deflector 240. The range of deflection in the X and Y directions is likely to be matched such that square subfields result. Movement of the electron beam 103 using the mainfield deflector 250 may be performed such that an array of subfields arise that cover the entire mainfield, or a least the part of the mainfield in which the current layer of the product 150 to be formed extends.

The detail from within the circle 305 of FIG. 3 shows how the mainfield 300 may be divided into an addressable grid of subfield squares 310 in this way. The subfields 310 are laid out side by side in a patchwork pattern with no overlapping addressable coordinates. Each subfield 310 measures 0.005 m by 0.005 m, corresponding to the range of movement of the subfield deflector 240.

The mainfield deflector 250, which is capable of deflecting the electron beam 103 to any of the subfield positions, places the electron beam 103 into these subfields 310 in turn. For example, the mainfield deflector 250 may position the electron beam 103 into a base position at the lower right of each subfield 310 as shown at 320. Irrespective of where the start position of the electron beam 103 is within the subfield 310, the subfield deflector 240 then scans the electron beam 103 to melt or raise the temperature of the powder in the subfield 310.

The scan may see the electron beam 103 traverse all of the area of the subfield 310, or the scan may see the electron beam 103 traverse only a part of the area of the subfield 310.

The shape traced by the electron beam 103 as it is scanned within a subfield 310 is referred to herein as a "primitive". A primitive may be smaller than a subfield or the same size as a subfield.

Typically primitives corresponding to simple shapes such as squares or triangles are used. In the example of FIG. 3, the subfields 310 are square and so a square primitive is used to scan the entire subfield. Moreover, primitives may be combined within a subfield to form a compound shape. For example, two different sized square primitives may be used to define an L-shape. Also, irregular primitives may be used, for example to allow an irregular edge of a product 150 to be formed. Examples of different shapes of primitives are provided below with reference to FIGS. 4 to 6.

The primitives are formed by scanning the electron beam 103 using the subfield deflector 240 to trace out the desired shape. For example, the subfield deflector 240 may cause the electron beam 103 to follow the raster pattern indicated by lines 330 of FIG. 3 until the electron beam 103 reaches an end position 340. In this way, a square primitive filling the whole of the subfield 310 is produced.

The spacing of the scan lines 330 may be set according to the size of the electron beam 103, the speed of the scan rate and the beam power, and other application specific parameters such as the material, pattern density and neighbouring features. The fast subfield deflector 240 allows power to be deposited in the powder bed 123 at controlled rates that allows managed dispersal of the thermal energy within the powder 122.

A further benefit is that the scanning required to expose the powder bed 123 within the subfield 310 is performed by the subfield deflector 240 which has a much faster and more accurate scan capability than is attainable using prior art machines, whilst the slower mainfield deflector 250 is simply used to position the electron beam 103, very precisely, at the required subfield start positions 320.

There is a substantial advantage to the fast subfield deflector 240 allowing power to be deposited in the powder bed 123 at controlled rates suitable for the engineered dispersal of thermal energy within the powder 122. Specifically, in effect, an area scan can be performed that allows the temperature within the whole area of the subfield 310 to be carefully controlled.

The fast scan rate allows an area to be scanned multiple times such that the heat dispersal between visits is relatively small, and therefore the area of the scan can be considered as if it had been exposed to a single large electron beam 103 of a very specific shape (i.e. the desired shape of the primitive or desired compound shape, for example a square where the electron beam 103 scans all of the area within the exemplary subfields 310 shown in FIG. 3). Thus, the electron beam 103 need no longer be considered as having a simple Gaussian beam profile but rather an extended shape capable of melting defined areas to form the desired primitives and compound shapes.

Thus, as the electron beam 103 is moved from subfield 310 to subfield 310, the layer of the product 150 being formed is effectively scanned subfield by subfield. This results in the layer of the product 150 effectively being formed by instantaneously forming the primitives or compound shapes in each subfield 310 in turn. The electron optical assembly 101 can therefore be envisioned as a shape generator, allowing the primitives and compound shapes to be "printed" to the powder bed 123. Thus, a layer to be formed may be decomposed into these primitive shapes rather than being decomposed into scan lines as is done in the prior art.

The power density incident on the powder bed 123 can be readily controlled through the subfield deflector 240 and the area the electron beam 103 traverses per unit time. The ability to separate out the power density delivered to the powder bed 123 from the current and energy of the electron beam 103 gives users another degree of freedom in which to develop the process parameters for a job. Moreover, the subfield scan rate and the high degree of accuracy of the subfield deflector 240 allows fine control of the melt pool formed in the subfield 310 and overcomes the need to run multiple melt pools simultaneously. It should be noted too that the lower inductance subfield deflector 240 will also have a much faster positional settling time that the mainfield deflector 250.

The mainfield 300 of FIG. 3 describes the basic reference grid for the electron gun assembly 101. The mainfield 300 is shown to measure 0.3 m×0.3 m, although this will be a machine model dependant parameter. The size of the subfield 310 can be selected by the user and will be dependent on the product 150 being manufactured. In the example of FIG. 3, the size of each subfield 310 has been selected as 0.005 m by 0.005 m, giving 360,000 subfields within the mainfield 300. The minimum pixel size for the scan resolution (i.e. each individual addressable location for the electron beam 103) is set by the user to a suitably small number relative to the size of the subfield 310. For example, adjacent pixel positions may be separated by $1\times10^{-6}$ m in both X and Y directions. This parameter may also be set by the user according to the product 150 to be made. In this example, there are 250,000 addressable pixel positions per subfield 310, allowing primitive shapes to be defined in fine detail, and $9\times10^{10}$ addressable pixel positions in the mainfield 300.

The resolution and accuracy of the mainfield deflector 250 is set by the controller 110, for example by a digital to analog converter (DAC) of the controller 110. As the mainfield deflector 250 must scan a larger area, it requires a higher bit count (circa 16 bits) compared to the subfield deflector 240 which covers a smaller area (circa 12 bits).

As described above, the present invention allows layers of the product 150 to be formed to be decomposed into primitive shapes that combine to describe the two-dimensional pattern to be exposed. This is in contrast to the prior art that uses a primitive shape that represents only a simple line, with a start and end point and a speed of traversal.

As will now be described with reference to FIGS. 4 to 6, a library of "primitive" shapes may be used to describe different shapes of products 150. For example, a layer may be decomposed into primitive shapes corresponding to squares, rectangles, triangles, hexagons and parallelograms, and any combinations thereof. Other shapes are also possible.

Figure 4:
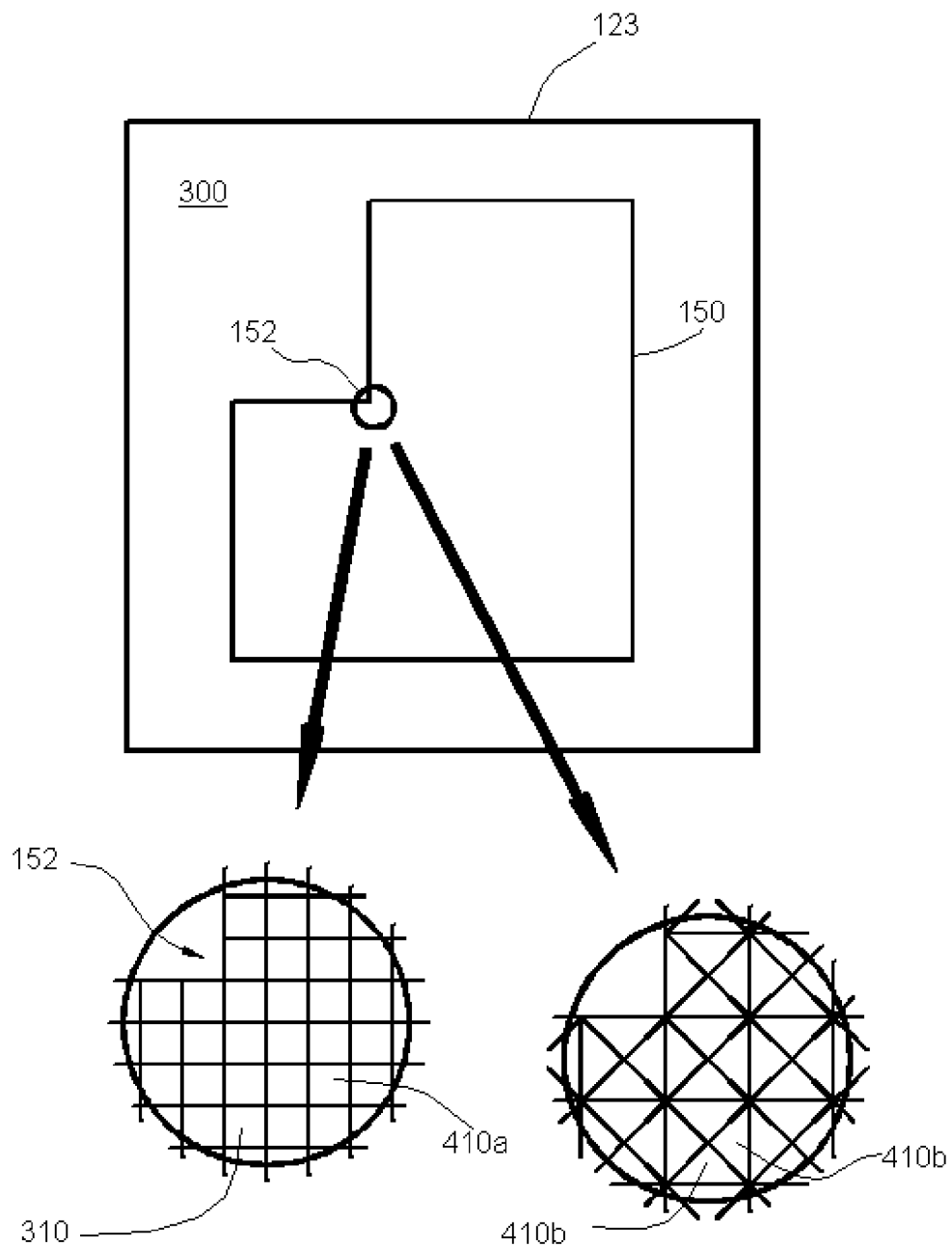
FIG. 4 is a schematic representation of a method of forming a layer of a product during additive layer manufacture according to an embodiment of the present invention.
Figure 5:
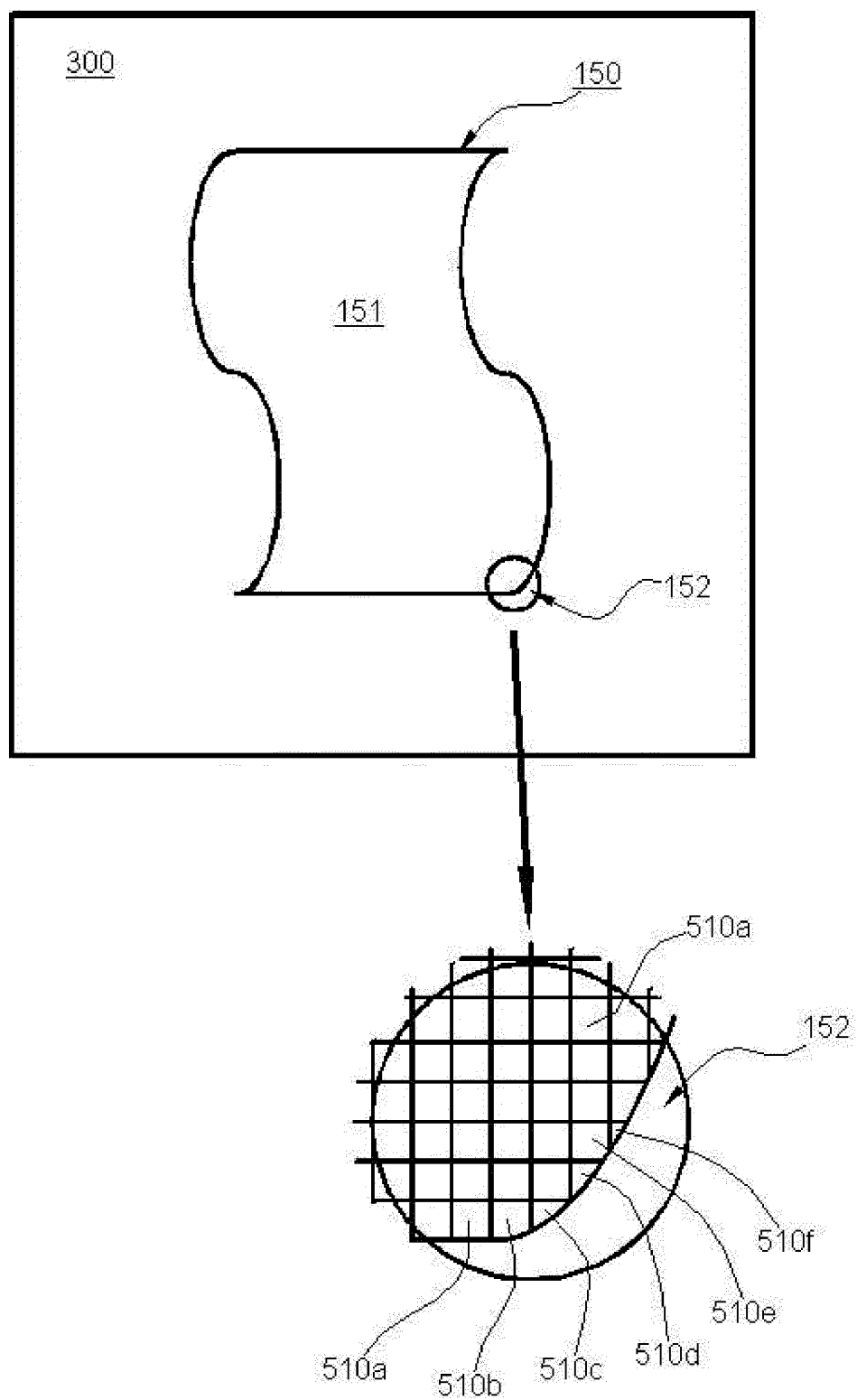
FIG. 5 is a schematic representation of a powder bed, a layer of another product to be formed, and another arrangement of primitives that cover the layer of the product.

FIG. 4 shows a layer 150 of a product to be formed in the powder bed 123. The extent of the mainfield 300 is shown in the figure, along with the division of the mainfield 300 into subfields 310 and also two examples of how the layer 151 may be decomposed into primitives. In the first example, the layer 151 is formed using square primitives 410a that correspond to the subfields 310. That is, each subfield 310 is completely filled by driving the subfield deflector 240 through its maximum range of deflection. The detail of FIG. 4 also shows how the square subfields 310 and primitives 410a may be arranged to fill a corner 152 to be formed in the layer 151. That is, the locations of the electron beam 103 set by the mainfield deflector 250 may be chosen such that the resulting subfields 310 align along the edges shown in the detail of FIG. 4.

The second detail of FIG. 4 shows the layer 151 decomposed into tessellating triangular primitives 410b. The size of the triangles may be chosen so as to fill the shape of the layer 151 as closely as possible to avoid the use of differently sized or differently shaped primitives 410. In order to allow the electron beam 103 to trace each primitive shape 410b, subfields 310 may be defined that overlap. Alternatively, the triangles 410b may be sized such that four adjacent triangles 410b fill a single square subfield 310. Then, the triangles 410b may be traced in turn within a single subfield 310, either consecutively with the mainfield deflector 250 maintaining the electron beam position in the subfield 310 or with intervals where the mainfield deflector 250 is used to send the electron beam 103 to other subfields 310 before returning to the subfield 310 to trace another triangle 410b.

As will be appreciated, not all shapes of layers 151 lend themselves to decomposing into primitives 410 of the same shape. FIG. 5 shows such an example. Here, the bulk of the layer 151 is decomposed into square primitives 510a that fill each subfield 310. However, the edges of the layer 151 require infilling with irregularly shaped primitives that may vary from one to the next as the edge of the layer 151 is followed. The detail of FIG. 5 shows a curving corner 152 that is filled with a succession of differently-shaped subfields 510b, c, d, e, f, etc., which have curved boundaries.

Different strategies may be used to determine the order in which to scan primitives 410, 510. For example, the electron beam 103 may be moved from one primitive 410, 510 to an adjacent primitive 410, 510 and so on. Other arrangements are possible though. For example, it may be advantageous not to scan a primitive 410, 510 until any adjacent primitives 410, 510 that have already been scanned have returned to ambient temperature or close to ambient temperature. The most efficient scanning strategy in order to manage the thermal cool down properties of the material will be decided by the application. The strategy allows for post melt thermal management whereby the electron beam 103 can be used to modify the thermal environment in order to create the desired material properties.

Figure 6:
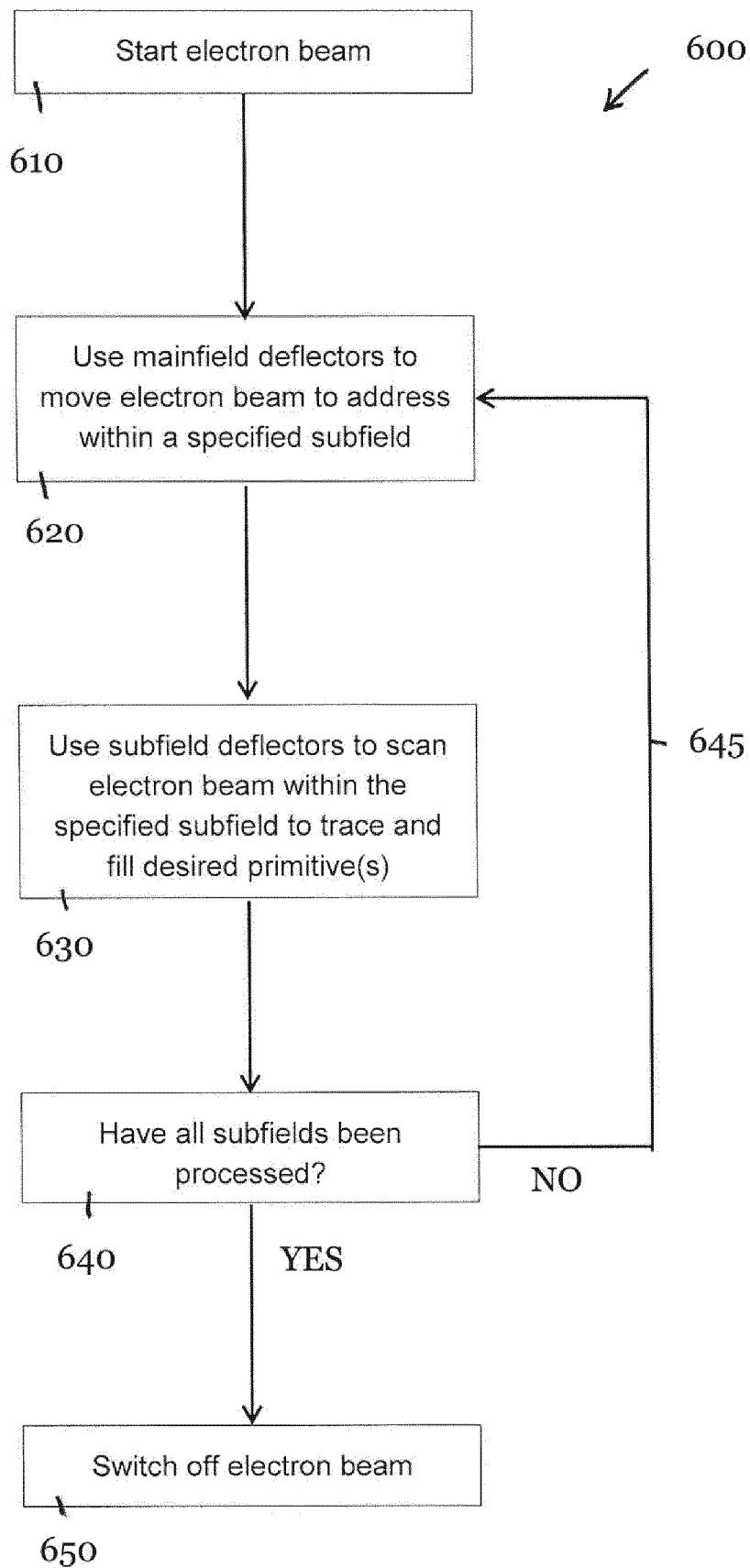
FIG. 6 is a schematic representation of a method of generating a scan pattern for forming a product using additive layer manufacture.

FIG. 6 shows a method 600 of forming a layer 151 of a product 150 according to an embodiment of the present invention. The method 600 begins at 610. In this example, the electron beam 103 is started at step 610. This may not always be required. For example, were a preceding layer 151 has just been formed, the electron beam 103 may be kept switched on while a new powder bed 123 is deposited. In this case, the electron beam 103 may be deflected away from the powder bed 123 to ensure that powder 122 is not melted as it is being deposited. Where the electron beam 103 is left switched on between layers, the electron current may be decreased in which case it may not be necessary to deflect the electron beam 103 away from the powder bed 123.

At step 620, the controller 110 uses the mainfield deflectors 250 to move the electron beam 103 to an address within the first subfield 310 to be processed. This address will be specified in a scan pattern file that is made accessible to the controller 110. As noted above, the scan rate of the electron beam 103 across the powder bed 123 will be relatively slow, compared to the subfield deflection, as it is moved by the mainfield deflectors 250.

With the electron beam 103 in position within the first specified subfield 310, the controller 110 uses the subfield deflectors 240 to scan the electron beam 103 within the subfield 310 to trace and fill the desired primitive shape, as indicated at step 630. As described above, the powder 122 within the primitive 410, 510 is effectively melted as a single area having the shape defined by the primitive 410, 510. As also described above, the primitive may be a compound shape formed of two or more primitives. The primitives may be any of the primitive shapes, but simply combined together to form the required compound shape. In this embodiment, each primitive is traced for each step 630, i.e. the electron beam 103 remains within a subfield 310 until all primitives have been scanned and hence the compound shape is complete.

At step 640, the controller 110 determines whether all subfields within the layer 151 that require processing have been processed. If not all subfields 310 that require processing have been processed, the method loops back via path 645 to return to step 620. At step 620, the controller 110 once again uses the mainfield deflectors 250 to move the electron beam 103, this time to the defined start position in the subfield 310 next specified in the scan pattern. The method will then continue to step 630 which sees that next subfield 310 processed by the electron beam 103 as directed by the controller using the subfield deflectors 240. Step 640 sees another check as to whether all subfields 310 within the current layer 151 that require scanning have been processed, with multiple loops through steps 620 to 640 being performed until all subfields 310 that require processing have been processed. At that stage, the outcome at step 640 will be positive, such that the method 600 exits to step 650.

In this example, at step 650, the electron beam 103 is switched off. However, the electron beam 103 may alternatively be reduced in current or left switched on but moved away so that powder 122 may be deposited to form the powder bed 123 for the next layer 151.

Figure 7:
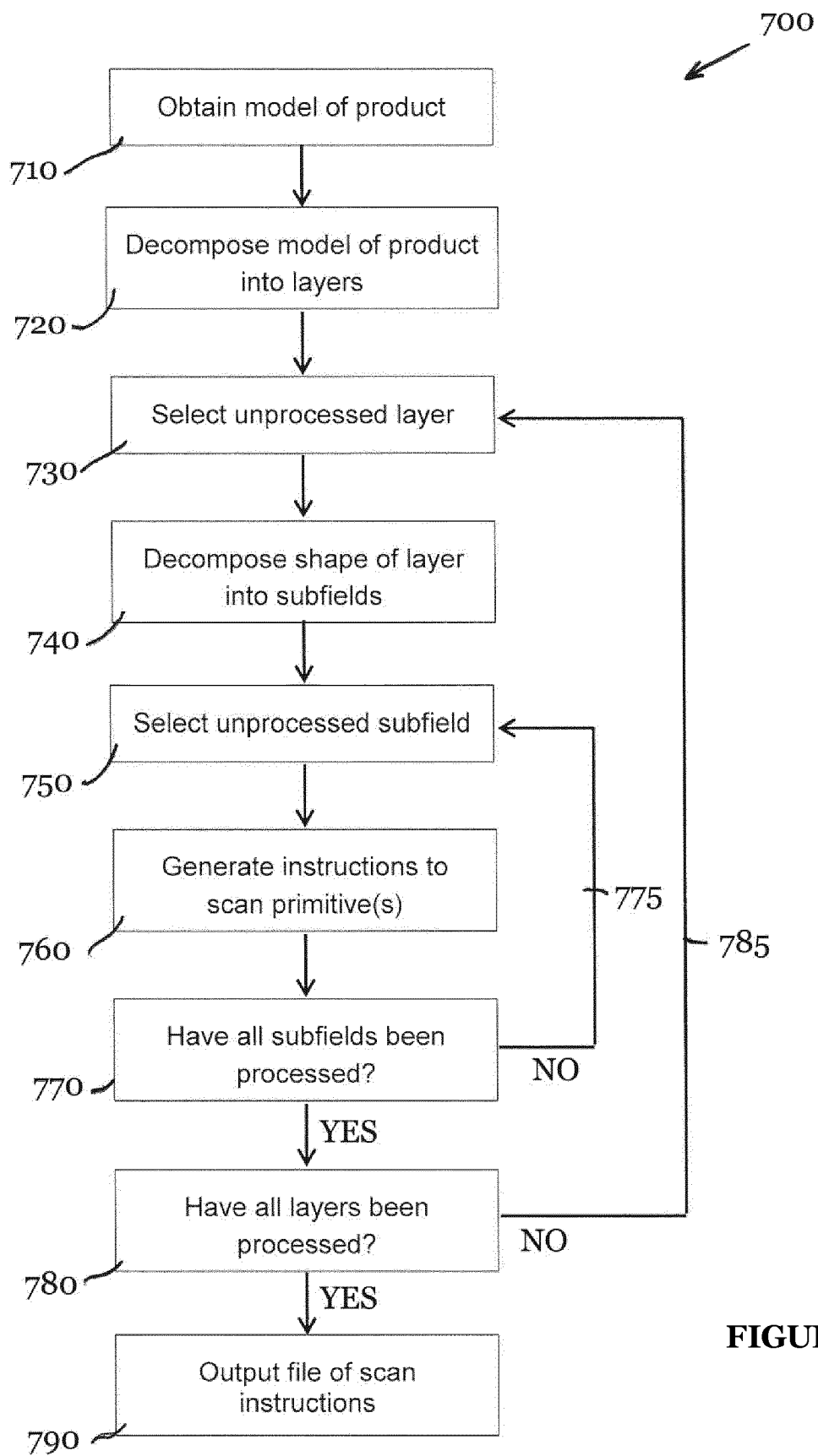
FIG. 7 is a schematic representation of a method of generating a scan pattern for forming a product using during additive layer manufacture.

FIG. 7 shows a method 700 of generating a scan pattern for forming a product 150 used during additive layer manufacture. The method 700 begins at step 710 where a model of the product 150 is obtained. This may comprise generating the model or may comprise receiving or accessing a computer file that contains a description of the model. In any event, step 710 sees a computer in possession of a computer file that describes the size and shape of the product 150 to be formed. Such files, and the method to produce them, are well known and so will not be described in any further detail.

At step 720, the computer decomposes the model of the product 150 into layers 151 where each layer 151 represents a layer 151 through the product 150 that will be formed in a single support table 130 position during the additive layer manufacture. Each layer 151 will be defined by a Z coordinate, and the shape of the layer 151 will be defined using X and Y coordinates.

Then, at step 730, the computer selects an unprocessed layer 151. This layer 151 may be the lowest layer 151. At step 740, the computer decomposes the shape of the selected layer 151 into subfields 310. With the layer 151 decomposed into subfields 310, the computer then generates instructions to move the electron beam 103 between all the subfields 310 using the mainfield deflector 250.

Then, at step 750, the computer selects an unprocessed subfield 310 and generates instructions to scan the primitive shape or shapes for that subfield at step 760. These instructions determine how the electron beam 103 is scanned within each subfield 310 as controlled using the subfield deflectors 240 to define the desired primitive shape or shapes. As noted above, this may be a compound shape formed of two or more primitives. This step 760 may be performed by analysing the shape of the subfield 152 and finding a suitably matched shape of primitive 410, 510 from a library of primitive shapes.

At step 770, the computer determines whether all subfields 310 in the current layer 151 have been processed. If not, the method 700 loops back along path 775 to step 750 where an unprocessed subfield 310 is selected and subsequently processed according to a further step 760, and the determination is again made at step 770. This repeated loop continues until the determination at step 770 indicates all subfields 310 in the current layer 151 have been processed. As shown in FIG. 7, when a positive determination is made at step 770, the method 700 continues to step 780 where another determination is made by the computer.

Namely, a determination is made to ensure that instructions are generated for all layers 151. As shown schematically in FIG. 7 at step 780, the computer in effect determines whether all layers 151 have been processed. If not, the method 700 loops back around path 785 to return to step 730 to ensure that the next layer 151 is selected at step 730 and processed at steps 740 to 770, and so on until all the layers 151 have been processed and a set of scan instructions has been generated that defines all layers 151 in the product 150.

When all layers 151 have been processed in this way, the method 700 continues to step 790 where the computer outputs a file containing the complete scan instructions. This file may be saved to memory, or may be sent to a controller like the controller 110 described above. In some embodiments, the controller 110 performs the functions of the computer, i.e. the controller 110 may perform the method 700 of FIG. 7 to generate the scan instructions and may then execute the scan instructions by performing the method 600 of FIG. 6. The scan instructions may be executed only after review and approval by a user.

Those skilled in the art will appreciate that variations may be made to the above embodiments without departing from the scope of the invention that is defined by the appended claims.

For example, the embodiments described above all use an electron beam 103 to melt the powder 122. However, other types of charged particle beam may be used in the place of the electron beam 103.

In FIG. 7, the subfields 310 are defined at step 740 and then the primitives 410, 510 are later defined at step 760. In this case, the primitives 410, 510 must be made to fit in with the pre-defined subfields 310. However, in other contemplated embodiments, more flexibility may be achieved by combining steps 740 to 770. That is, for each layer 151 the layer 151 is decomposed into subfields 310 and primitives 410, 510 at the same time. By doing this, the placement of the subfields 310 may be determined to optimise the selection of primitives 410, 510. For example, the corner filling method described above with reference to the detail shown in FIG. 4 may be implemented in this way.

The invention claimed is:

1. A method of forming a product using additive layer manufacture, comprising:
    forming the product as a series of layers, each layer being formed by fusing powder deposited as a powder bed by irradiating the powder with a charged particle beam, comprising scanning the charged particle beam to fuse powder to form a desired layer shape;
    wherein, for each layer, the method comprises scanning the charged particle beam using a combination of a long-range deflector and a short-range deflector, wherein the long-range deflector deflects the charged particle beam over a larger deflection range than the short-range deflector, wherein scanning the charged particle beam comprises;
    repeatedly using the long-range deflector to set an array of base positions of the charged particle beam on the powder bed;
    using the short-range deflector to scan the charged particle beam around each of the array of base positions set by the long-range deflector to trace a pattern on the powder bed to fuse the powder in a predetermined shape at each base position, such that wherein the predetermined shapes at the array of base positions combine to create form the desired layer shape of fused powder,
    wherein using the short-range deflector comprises controlling the current of the charged particle beam and the scan speed of the short-range deflector to raise and maintain the temperature of the powder bed evenly within each predetermined shape.

2. The method of claim 1, comprising using the short-range deflector to trace a series of patterns to fuse the powder in a respective series of predetermined shapes, the majority of which have a common size and shape and tessellate to form part of the desired layer shape.

3. The method of claim 2, wherein the predetermined shapes scanned by the charged particle beam about each base position tessellate without leaving gaps therebetween thereby forming a part of the desired layer shape.

4. The method of claim 2, comprising using the long-range deflector to scan the charged particle beam at a first speed and using the short-range deflector to scan the charged particle beam at a second speed, wherein the first speed is slower than the second speed.

5. The method of claim 4, comprising using an electromagnetic deflector comprising paired current-carrying coils with more than 25 turns per coil for long-range deflection, and an electromagnetic deflector comprising a paired current-carrying coils with fewer than 5 turns per coil for short-range deflection.

6. The method of claim 1, comprising: maintaining the setting of the long-range deflector at each of the array of base positions while varying the setting of the short-range deflector to scan the charged particle beam around each base position set by the long-range deflector.

7. The method of claim 1, comprising: varying the long-range deflector to scan the charged particle beam through the array of base positions of the charged particle beam on the powder bed while varying the setting of the short-range deflector to scan the charged particle beam around the base positions set by the long-range deflector.

8. A charged particle optical assembly for use in additive layer manufacture, arranged to form a product in a series of layers, each layer formed by irradiating a powder bed using a charged particle beam to fuse powder to form a desired layer shape, the assembly comprising:
    a charged particle source;
    a beam forming apparatus operable to form the beam of charged particles from the charged particles provided by the charged particle source that travels along a direction of propagation; and
    a beam steering apparatus;
    wherein the beam steering apparatus comprises a long-range deflector operable to deflect the charged particle beam over a first deflection range and a short-range deflector operable to deflect the charged particle beam over a second deflection range, wherein the first deflection range is larger than the second deflection range;
    wherein the long-range deflector is configured to be used repeatedly to set an array of base positions of the charged particle beam on the powder bed; and
    the short-range deflector is configured to be used to scan the charged particle beam around each of the array of different base positions set by the long-range deflector to trace a pattern on the powder bed to fuse the powder in a predetermined shape at each base position, such that wherein the predetermined shapes at the array of base positions combine to form the desired layer shape of fused powder,
    wherein the current of the charged particle beam is controlled and the scan speed of the short-range deflector is controlled to raise and maintain the temperature of the powder bed evenly within each predetermined shape.

9. The charged particle optical assembly of claim 8, wherein the long-range deflector is arranged to cause the charged particle beam to deflect transversely to the direction of propagation.

10. The charged particle optical assembly of claim 9, wherein the long-range deflector comprises first and second deflectors arranged to act orthogonally with respect to each other and to the direction of propagation.

11. The charged particle optical assembly of claim 8, wherein the short-range deflector is arranged to cause the charged particle beam to deflect transversely to the direction of propagation.

12. The charged particle optical assembly of claim 11, wherein the short-range deflector comprises first and second deflectors arranged to act orthogonally with respect to each other and to the direction of propagation.

13. The charged particle optical assembly of claim 12 when dependent upon claim 10, wherein the first deflectors of the long-range deflector and the short-range deflector are arranged to deflect the charged particle beam in a common direction, and the second deflectors of the long-range deflector and the short-range deflector are arranged to deflect the charged particle beam in a common direction.

14. The charged particle optical assembly of claim 13, wherein the first and second deflectors of both the long-range deflector and the short-range deflector comprise paired current-carrying coils comprising a coil of wire or other electrical current-carrying medium arranged to either side of the charged particle beam path.

15. The charged particle optical assembly of claim 14, wherein the coils of the long-range deflector comprise 50 to 100 turns of wire and/or wherein the coils of the short-range deflector comprise 1 to 5 turns of wire.

16. The charged particle optical assembly of claim 8, wherein the first and second deflectors of both the long-range deflector and the short-range deflector comprise electrostatic deflectors that are arranged to either side of the charged particle beam path.

17. The charged particle optical assembly of claim 8, wherein the charged particles are electrons and the charged particle source is an electron source.

18. An additive layer manufacturing apparatus comprising:
- the charged particle optical assembly of claim 8;
- at least one hopper operable to dispense powder; and
- a table positioned to receive the powder dispensed by the at least one hopper in a volume defining a powder bed for receiving the charged particle beam.

19. The apparatus of claim 18, wherein the long-range deflector is operable to scan the electron beam over at least half the area of the powder bed and the short-range deflector is operable to scan the electron beam over less than half the area of the powder bed.

20. The additive layer manufacturing apparatus of claim 18, further comprising a controller programmed to perform a method of forming a product using additive layer manufacture, the method comprising:
- forming the product as a series of layers, each layer being formed by fusing powder deposited as a powder bed by irradiating the powder with a charged particle beam, comprising scanning the charged particle beam to fuse powder to form a desired layer shape;
- wherein, for each layer, the method comprises scanning the charged particle beam using a combination of a long-range deflector and a short-range deflector wherein the long-range deflector deflects the charged particle beam over a larger deflection range than the short-range deflector, wherein scanning the charged particle beam comprises:
- repeatedly using the long-range deflector to set an array of base positions of the charged particle beam corresponding respectively to the series of areas of the powder bed,
- using the short-range deflector to scan the charged particle beam around each of the array of base positions set by the long-range deflector to trace a pattern on the powder bed to fuse the powder in a predetermined shape at each base position, such that predetermined shapes at the array of base positions combine to form the desired layer shape of fused powder,
- wherein using the short-range deflector comprises controlling the current of the charged particle beam and the scan speed of the short-range deflector to raise and maintain the temperature of the powder bed evenly within each predetermined shape.

* * * * *